(12) United States Patent
Yoshida

(10) Patent No.: US 7,504,703 B2
(45) Date of Patent: Mar. 17, 2009

(54) SEMICONDUCTOR INTEGRATED CIRCUIT DEVICE

(75) Inventor: Takeshi Yoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 467 days.

(21) Appl. No.: 11/332,509

(22) Filed: Jan. 17, 2006

(65) Prior Publication Data

US 2006/0164130 A1  Jul. 27, 2006

(30) Foreign Application Priority Data

Jan. 17, 2005  (JP)  ............................. 2005-009344

(51) Int. Cl.
*H01L 29/00* (2006.01)
(52) U.S. Cl. ............................. 257/499; 257/E25.005
(58) Field of Classification Search ................. 257/499, 257/E21.003, E21.005
See application file for complete search history.

(56) References Cited

U.S. PATENT DOCUMENTS 5,122,846 A    6/1992   Haken
5,206,533 A    4/1993   Houston
5,338,963 A    8/1994   Klaasen et al.
6,472,715 B1  10/2002   Liu et al.
6,730,947 B2   5/2004   Kuwazawa
6,876,572 B2   4/2005   Turner

FOREIGN PATENT DOCUMENTS

| EP | 0 499 824 A1 | 8/1992 |
| JP | 6-151771 A | 5/1994 |
| JP | 2003-100904 A | 4/2003 |
| JP | 2005-39210 A | 2/2005 |

*Primary Examiner*—Lex Malsawma
(74) *Attorney, Agent, or Firm*—Foley & Lardner LLP

(57) ABSTRACT

A semiconductor integrated circuit device includes a semiconductor substrate having a first surface. First wells of first conductive type are formed on the semiconductor substrate. Second wells of second conductive type are formed on the semiconductor substrate. The first wells surround each of the second wells on the first surface. The second wells surround each of the first wells on the first surface. One of the first wells and one of the second wells which are adjacent to each other compose a well pair. An inverter pair is composed of a first inverter and a second inverter. An input and an output of the first inverter are electrically connected to an output and an input of the second inverter respectively. Transistors composing the inverter pair are formed in the well pair.

7 Claims, 5 Drawing Sheets

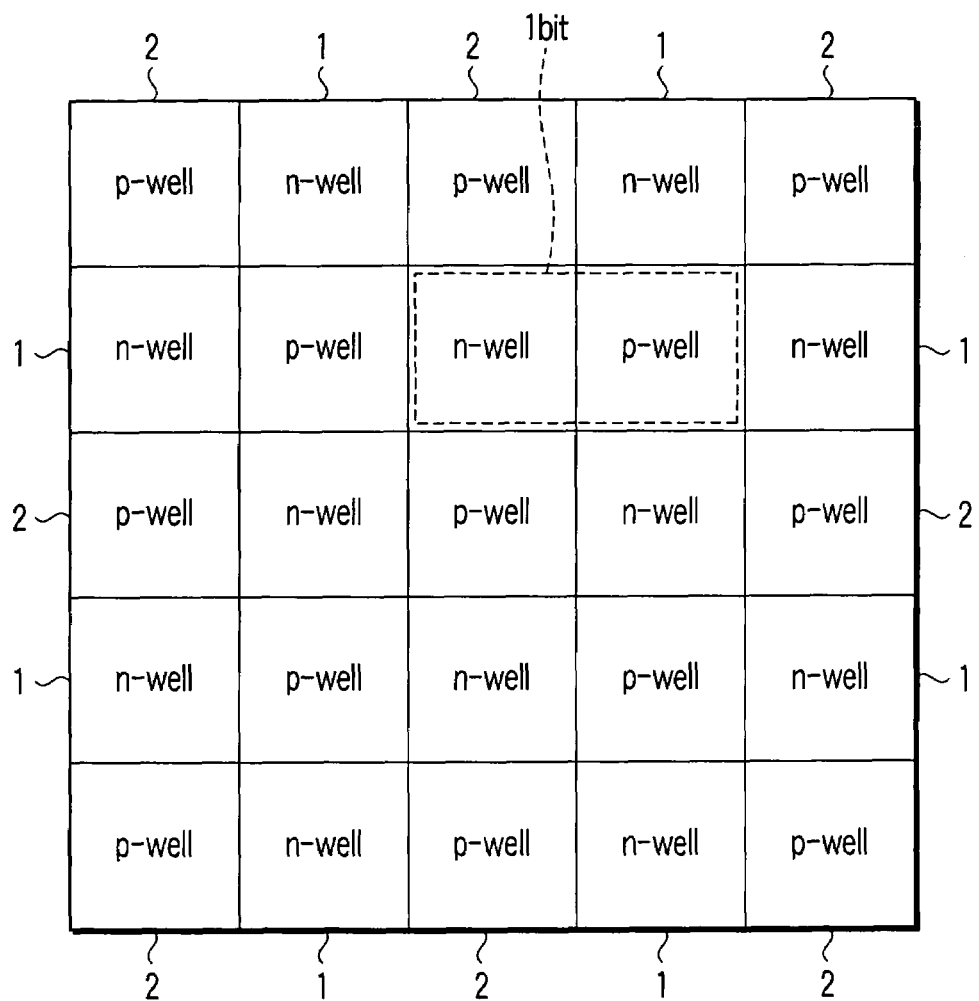
F I G. 1

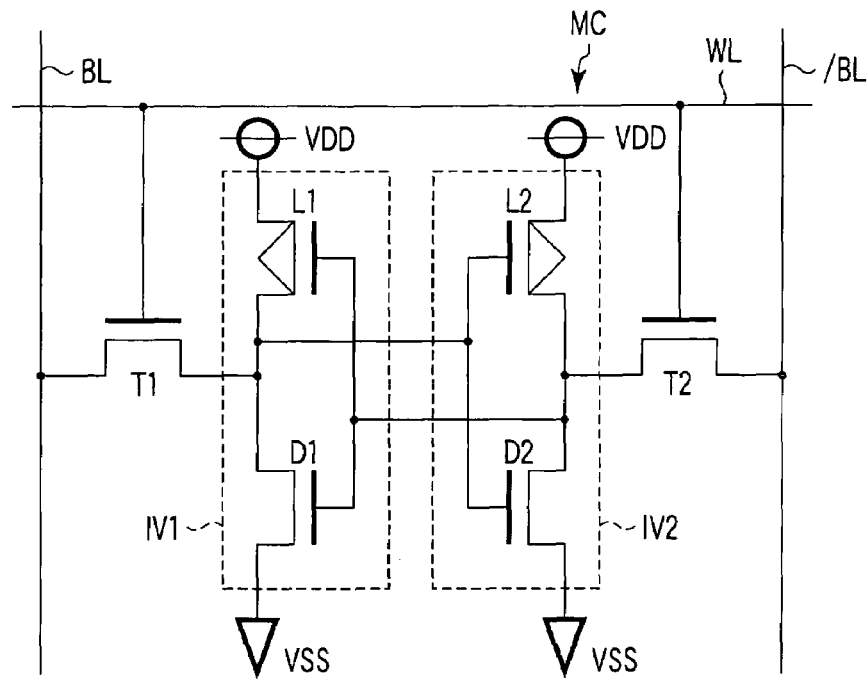
F I G. 4
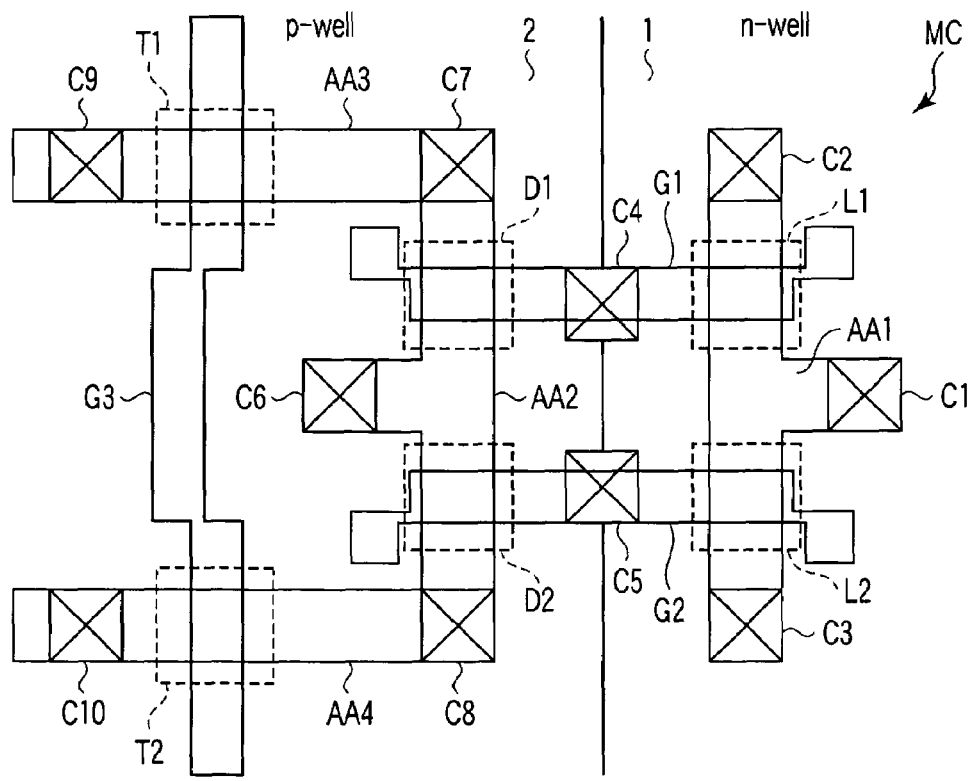
F I G. 5

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-009344, filed Jan. 17, 2005, the entire contents of which are incorporated herein by reference.

BACKGROUND OF THE INVENTION

1. Field of the Invention

The present invention relates to a semiconductor integrated circuit device, and relates to, for example, an arrangement of wells of a static random access memory (SRAM) and a flip-flop circuit.

2. Description of the Related Art

Recently, as a semiconductor integrated circuit devices is formed more densely, a power supply voltage is being reduced to nearly 1.0 V. Accordingly, a data retaining ability of SRAM becomes a problem. SRAM retains voltage information, and therefore, a slight change in a voltage due to noises or the like may easily destroy retained data under small power supply voltage. As a result, a problem of defective SRAM is being highlighted.

Particularly, a soft error is getting serious enough to restrict shipping of SRAM products due to its reliability problem. The soft error is a phenomenon such that fine particles of α rays, neutron radiation and the like butt against elements, its energy forms electron/positive hole pairs, and these electric charges destroy data retained by the elements.

As a countermeasure in a form of circuits against the problem of destruction of data, mounting of an error correct circuit (ECC) is being mainstream. The ECC checks a parity bit added to cell data of a memory so as to automatically find destroyed cell data and restore them. The countermeasure using the ECC is effective for the case of rather small destruction of the cell data.

Even the soft error countermeasure using the ECC, however, cannot cope with some cases because of the following reason. At present, as shown in FIG. 1 of Jpn. Pat. Appln. KOKAI Publication No. 2003-100904, linear n-type wells NWEL and p-type wells PWEL are formed in order to facilitate the integration of memory cells. Transistors composing the memory cells are formed in the wells NWEL and PWEL. Therefore, the memory cells which are adjacent to each other in a direction in which the wells NWEL and PWEL extend share the same well. For this reason, it is strongly possible that electrons and positive holes generated by butting of fine particles of α rays, neutron radiation and the like propagate through the wells NWEL and PWEL so as to influence the other transistors. Because the chain reaction simultaneously destroys a lot of cell data, even ECC cannot restore all cell data. For this reason, the soft error countermeasure using the ECC cannot be perfect.

BRIEF SUMMARY OF THE INVENTION

According to a first aspect of the present invention, there is provided a semiconductor integrated circuit device comprising: a semiconductor substrate having a first surface; first wells of first conductive type formed on the semiconductor substrate; second wells of second conductive type formed on the semiconductor substrate, the first wells surrounding each of the second wells on the first surface, the second wells surrounding each of the first wells on the first surface, one of the first wells and one of the second wells which are adjacent to each other composing a well pair; and an inverter pair composed of a first inverter and a second inverter, an input and an output of the first inverter being electrically connected to an output and an input of the second inverter respectively, transistors composing the inverter pair being formed in the well pair.

According to a second aspect of the present invention, there is provided a semiconductor integrated circuit device comprising: a semiconductor substrate having a first surface; first wells of first conductive type formed on the semiconductor substrate; second wells of second conductive type formed on the semiconductor substrate, the first wells surrounding each of the second wells on the first surface, the second wells surrounding each of the first wells on the first surface, two of the second wells and one of the first wells which is adjacent to and sandwiched by the two second wells composing a well group; and a storage circuit including a first inverter, a second inverter, a first transistor of the first conductive type and a second transistor of the first conductive type, an input and an output of the first inverter being electrically connected to an output and an input of the second inverter respectively, one end of the first transistor being electrically connected to the output of the first inverter, one end of the second transistor being electrically connected to the output of the second inverter, transistors composing the first inverter and the second inverter and the first transistor and the second transistor being formed on the well group.

According to a third aspect of the present invention, there is provided a semiconductor integrated circuit device comprising: a semiconductor substrate having a first surface; first wells of first conductive type formed on the semiconductor substrate; second wells of second conductive type formed on the semiconductor substrate, the first wells and the second wells being arranged in a check pattern on the first surface, one of the first wells and one of the second wells which are adjacent to each other composing a well pair; and an inverter pair composed of a first inverter and a second inverter, an input and an output of the first inverter being electrically connected to an output and an input of the second inverter respectively, transistors composing the inverter pair being formed in the well pair.

BRIEF DESCRIPTION OF THE SEVERAL VIEWS OF THE DRAWING

FIG. 1 is a top view illustrating an arrangement of wells in a semiconductor integrated circuit device according to an embodiment of the present invention;

FIG. 4 is a circuit diagram illustrating a typical SRAM memory cell;

FIG. 5 is a top view illustrating one example of a structure of an SRAM memory cell;

DETAILED DESCRIPTION OF THE INVENTION

Figure 2:
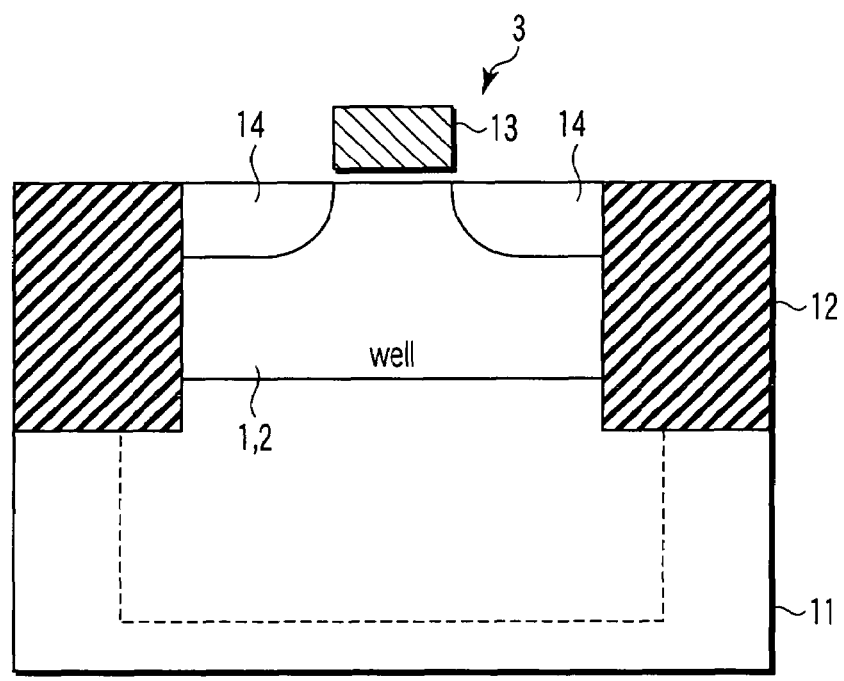
FIG. 2 is a sectional view illustrating a main section of the semiconductor integrated circuit device according to the embodiment.

An embodiment of the present invention is explained below with reference to the drawings. In the following explanation, like members having the same functions and constitutions are designated by like reference numerals, and repetitive explanations are given only if necessary.

FIG. 1 is a top view illustrating an arrangement of wells in a semiconductor integrated circuit device according to the embodiment of the present invention. As shown in FIG. 1, n-type wells (n-wells) 1 and p-type wells (p-wells) 2 are provided on a surface of a semiconductor substrate. The well 1 is surrounded by the wells 2, and the well 2 is surrounded by the wells 1. In a typical manner, the wells 1 and 2 are quadrate, and they are arranged alternately in an up-down direction and in a right-left direction on the sheet. As a result, the wells 1 and 2 are distributed in a checkered pattern.

FIG. 2 is a sectional view illustrating a main section of the semiconductor integrated circuit device according to the embodiment. As shown in FIG. 2, an element isolation insulating film 12 having a shallow trench isolation (STI) structure or the like is formed on the surface of the semiconductor substrate 11 around the wells 1 and 2. Conventionally, as shown in FIG. 1 of Jpn. Pat. Appln. KOKAI Publication No. 2003-100904, wells NWEL and PWEL must not be isolated by the element isolation insulating film to allow memory cells to share the wells NWEL and PWEL. For this reason, as shown by a broken line of FIG. 2, a bottom of the well is at a deeper position than a bottom of the element isolation insulating film 12. On the contrary, this embodiment does not require such a constitution, and thus, the bottoms of the wells 1 and 2 are at a shallower position than the bottom of the element isolation insulating film 12. As a result, the wells 1 and 2 are completely electrically insulated from the other wells 1 and 2.

A p-type metal insulator semiconductor field effect transistor (MISFET) is formed in the well 1, and an n-type MISFET is formed in the well 2. As shown in FIG. 2, a transistor 3 includes at least a gate electrode 13 provided on the semiconductor substrate 11 via a gate insulating film (not shown) and a pair of source/drain regions 14 formed on the surface of the semiconductor substrate 11 so as to sandwich a channel region under the gate electrode 13.

The transistors 3 in the two adjacent wells 1 and 2 form an element which can retain one-bit information. This element is fitted into a pair of the two wells 1 and 2 (well pair) and does not extent to the other wells 1 and 2. Such an element includes, for example, a latch circuit typified by a flip-flop circuit, and a memory cell of SRAM.

Figure 3:
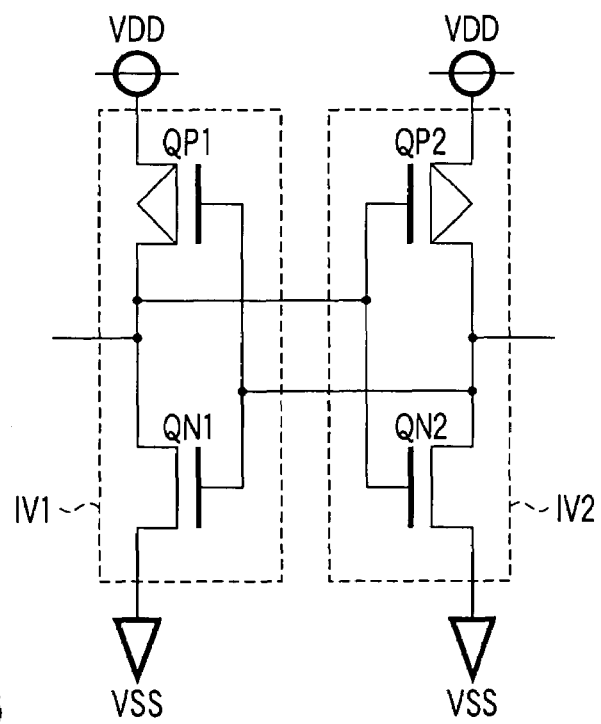
FIG. 3 is a circuit diagram illustrating a typical flip-flop circuit.

As shown in FIG. 3, the flip-flop circuit is composed of, for example, two inverters IV1 and IV2. The inverter IV1 is composed of a p-type transistor QP1, and an n-type transistor QN1 which are connected in series. The inverter IV2 is composed of a p-type transistor QP2 and an n-type transistor QN2 which are connected in series. An input terminal and an output terminal of the inverter IV1 are connected to an output terminal and an input terminal of the inverter IV2, respectively.

As shown in FIG. 4, a memory cell MC of SRAM has, for example, the inverters IV1 and IV2, and transfer transistors T1 and T2. The inverter IV1 is composed of a p-type load transistor L1 and an n-type driver transistor D1 which are connected in series. A gate of the load transistor L1 and a gate of the driver transistor D1 are connected to each other. A power supply potential VDD is supplied to an end of the inverter IV1 on the side of the load transistor L1, and a ground potential VSS is supplied to an end of the inverter IV1 on the side of the driver transistor D1.

Similarly, the inverter IV2 is composed of a p-type load transistor L2 and an n-type driver transistor D2 which are connected in series. A gate of the load transistor L2 and a gate of the driver transistor D2 are connected to each other. A power supply potential VDD is supplied to an end of the inverter IV2 on the side of the load transistor L2, and a ground potential VSS is supplied to an end of the inverter IV2 on the side of the driver transistor D2.

An input terminal of the inverter IV1 is connected to an output terminal of the inverter IV2, and an output terminal of the inverter IV1 is connected to an input terminal of the inverter IV2. The output terminal of the inverter IV1 is connected to a bit line BL via the n-type transfer transistor T1, and the output terminal of the inverter IV2 is connected to a bit line /BL via the n-type transfer transistor T2. The gates of the transfer transistors T1 and T2 are connected to a word line WL.

FIG. 5 is a top view illustrating one example of a structure of the memory cell MC. As shown in FIG. 5, a T-shaped active region AA1 is formed in the n-well 1. A contact C1 which is a protrusion of the T-shaped active region AA1 is electrically connected to a supply end of the power supply potential VDD. Contacts C2 and C3 are formed on ends of the active region AA which face each other.

Gate electrodes G1 and G2 are provided above the active region AA1. The gate electrodes G1 and G2 cross the active region AA1 and extend above the n-well 1 and the p-well 2. Contacts C4 and C5 are provided on the gate electrodes G1 and G2, respectively. The gate electrode G1 and diffusion layers formed in portion of the active region AA1 at upper and lower sides of the gate electrode G1 compose the load transistor L1. The gate electrode G2 and diffusion layers formed in portion of the active region AA1 at upper and lower sides of the gate electrode G2 compose the load transistor L2.

An active region AA2 is provided in the p-well 2 in parallel with the active region AA1. The active region AA2 passes below the gate electrodes G1 and G2. The gate electrode G1 and diffusion layers formed in portion of the active region AA2 at upper and lower sides of the gate electrode G1 compose the driver transistor D1. The gate electrode G2 and diffusion layers formed in portion of the active region AA2 at upper and lower sides of the gate electrode G2 compose the driver transistor D2.

The active region AA2 has a protrusion on which a contact C6 is formed. The contact C6 is electrically connected to a supply end of the ground potential VSS. Rectangular-shaped active regions AA3 and AA4 are provided along a direction perpendicular to the active region AA2. One end of the active region AA2 is connected to one end of the active region AA3, and a contact C7 is provided on the connected portion. A contact C9 is provided on the active region AA3. The contact C9 is electrically connected to the bit line BL.

The other end of the active region AA2 is connected to one end of the active region AA4, and a contact C8 is provided on the connected portion. A contact C10 is provided on the active region AA4. The contact C10 is electrically connected to the bit line /BL.

A gate electrode G3 is provided above the active regions AA3 and AA4 so as to cross the active regions AA3 and AA4. The gate electrode G3 serves as the word line WL. The gate electrode G3 and diffusion layers formed in portion of the active region AA3 on the right and left sides of the gate electrode G3 compose the transfer transistor T1. The gate electrode G3 and diffusion layers formed in portion of the active region AA4 on the right and left sides of the gate electrode G3 compose the transfer transistor T2.

The contacts C2, C5 and C7 are electrically connected to one another by an upper wiring layer. The contacts C3, C4 and C8 are electrically connected with one another by an upper wiring layer.

Figure 6:
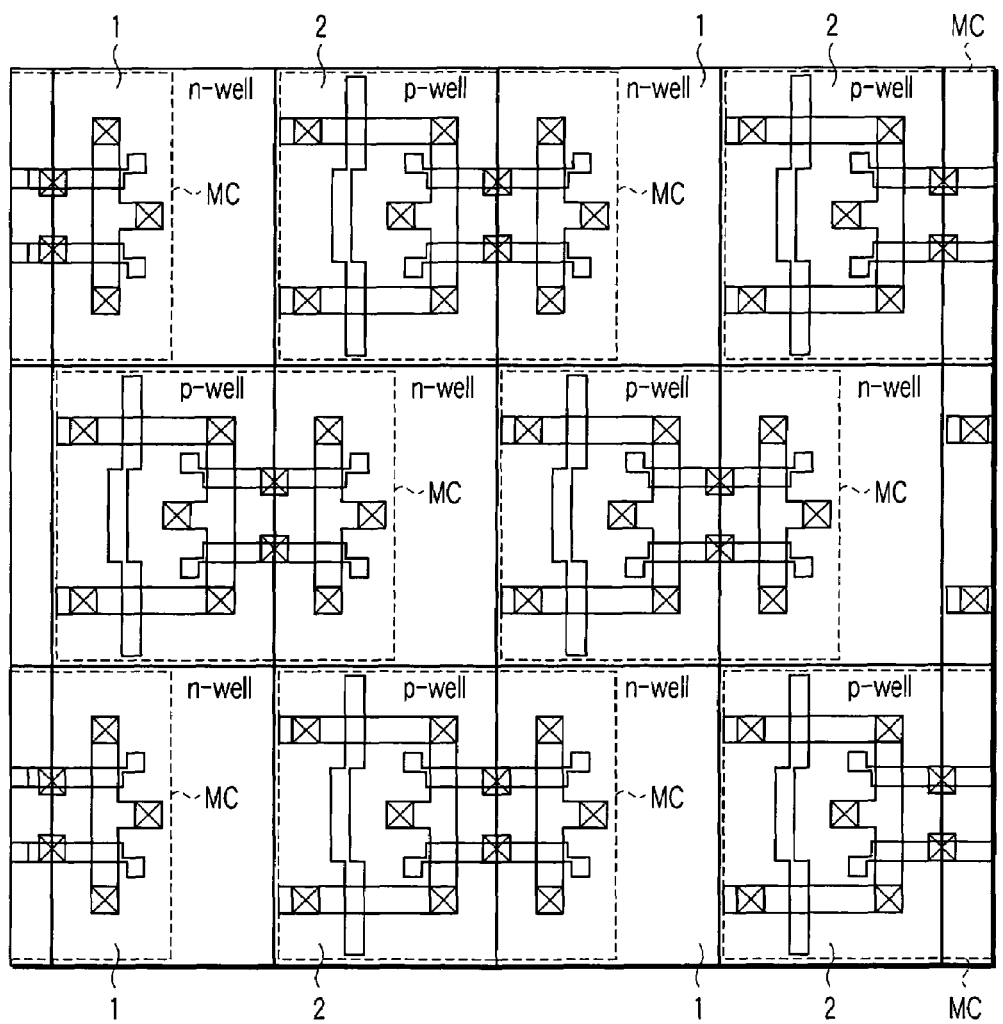
FIG. 6 is a top view illustrating a main section of the semiconductor integrated circuit device according to the embodiment.

The structure shown in FIG. 5 realizes the SRAM memory cell MC which is fitted into the well pair composed of one n-well 1 and one p-well 2. Such a memory cell is arranged in each of the well pairs which are arranged as shown in FIG. 1. This state is shown in FIG. 6. Each well 1 and each well 2 belong to only one well pair, and are not shared by another well pair.

In the semiconductor integrated circuit device according to the embodiment of the invention, one of the n-well 1 and the p-well 2 surrounds the other, and bottoms of the wells 1 and 2 are formed at a shallower position than the bottom of the element isolation insulating film 12. For this reason, the wells 1 and 2 are electrically insulated from each other. An element which can retain one-bit information is fitted into the well pair composed of adjacent one n-well 1 and one p-well 2. Such elements are electrically isolated from one another to prevent propagation of data destruction at an element due to a soft error to another one. Accordingly, the semiconductor integrated circuit device with few errors can be realized. Particularly, when the embodiment is applied to an SRAM memory cell with a low power supply voltage, SRAM with high resistance to the soft error can be obtained.

MODIFIED EXAMPLE

When the structure shown in FIG. 5 is adopted, the independent SRAM memory cell can be realized per well pair. Besides the structure shown in FIG. 5, an SRAM memory cell of so-called point-symmetrical type is known. Conventionally, even in the point-symmetrical memory cell, rectangular wells NWEL and PWEL are arranged alternately, and a memory cell is formed on the wells NWEL and PWEL having such a configuration, as shown in FIG. 1 of Jpn. Pat. Appln. KOKAI Publication No. 2003-100904. On the contrary, in a modified example of the embodiment, a point-symmetrical-type memory cell MC is formed in the n-well 1 and the p-well 2 which are arranged as shown in FIG. 1.

Figure 7:
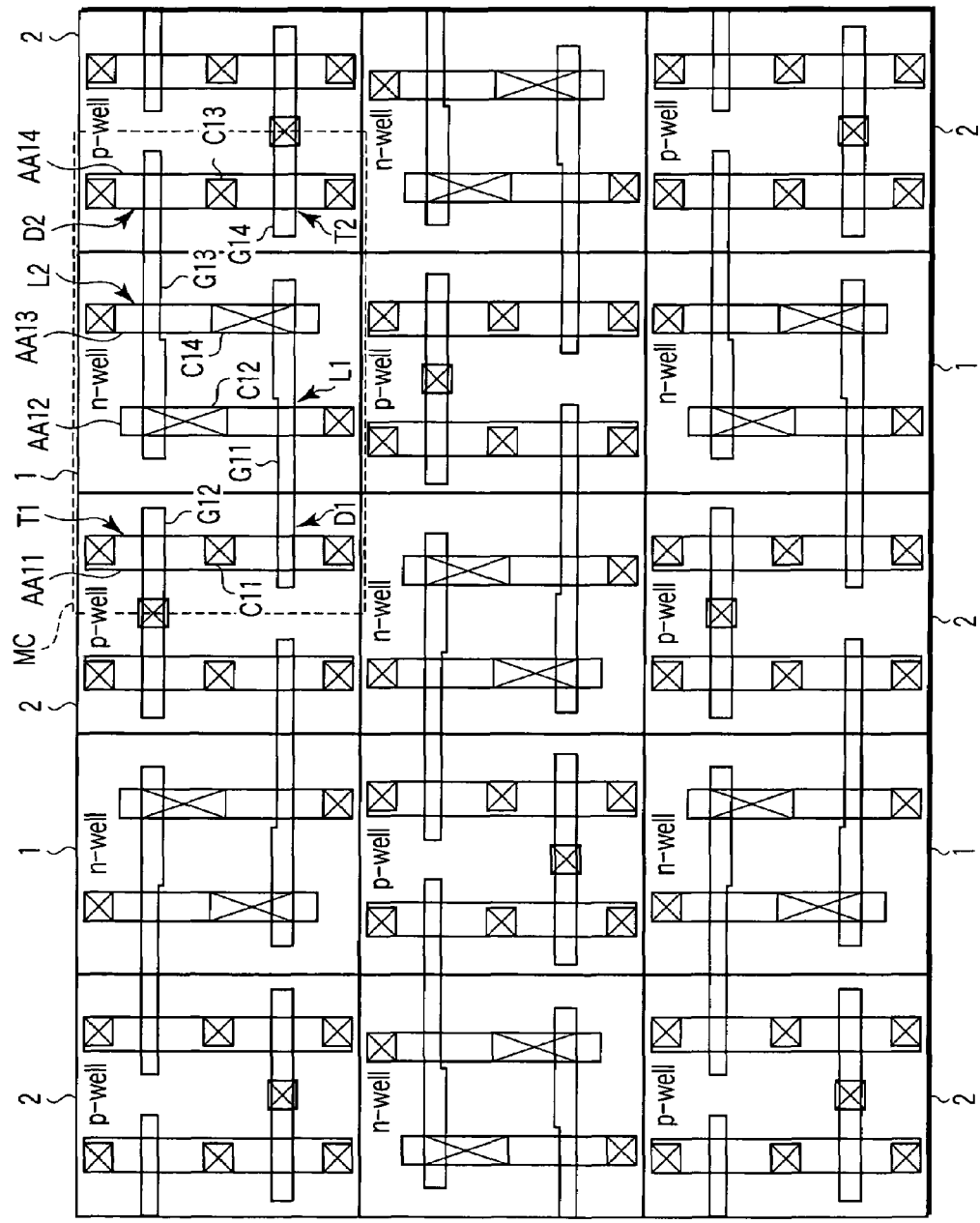
FIG. 7 is a top view illustrating a main section of a semiconductor integrated circuit device as another example according to the embodiment of the invention.

FIG. 7 is a top view illustrating a main section of a semiconductor integrated circuit device as another example according to the embodiment of the invention. A portion surrounded by a broken line in FIG. 7 configures the SRAM memory cell MC of 1 bit. As shown in FIG. 7, the memory cell MC extends over a well group formed by the two p-wells 2 and one n-well 1 which is sandwiched between the two p-wells 2. The memory cell MC has four active regions AA11 to AA14 along the same direction. The active regions AA11 and AA14 are formed in the p-wells 2, and the active regions AA12 and AA13 are formed in the n-wells 1.

The gate electrode G11 crosses above the active regions AA11, AA12 and AA13. The gate electrode G11 and diffusion layers formed in portion of the active region AA11 at upper and lower sides of the gate electrode G11 compose the driver transistor D1. The portion of the active region AA11 at lower side of the gate electrode G11 is electrically connected to the supply end of the ground potential VSS.

The gate electrode G11 and diffusion layers formed in portion of the active region AA12 at upper and lower sides of the gate electrode G11 in compose the load transistor L1. The portion below the gate electrode G11 in the active region AA13 is electrically connected to the supply end of the power supply potential VDD.

A gate electrode G12 crosses above the active region AA11. The gate electrode G12 and diffusion layers formed in portion of the active region AA11 at upper und lower sides of the gate electrode G12 compose the transfer transistor T1. A contact C11 provided on the active region AA11 between the gate electrodes G11 and G12 is electrically connected to a contact C12 on the active region AA12 via an upper wiring layer.

A gate electrode G13 crosses above the active regions AA12, AA13 and AA14. The gate electrode G13 and diffusion layers formed in portion of the active region AA14 at upper and lower sides of the gate electrode G13 compose the driver transistor D2. The portion of the active region AA14 at upper side of the gate electrode G13 is electrically connected to the supply end of the ground potential VSS.

The gate electrode 13 and diffusion layers formed in portion of the active region AA13 at upper and lower sides of the gate electrode G13 compose the load transistor L2. The portion of the active region AA13 at upper side of the gate electrode G13 is electrically connected to the supply end of the power supply potential VDD.

A gate electrode G14 crosses above the active region AA14. The gate electrode G14 and diffusion layers formed in portion of the active region AA14 at upper and lower sides of the gate electrode G14 compose the transfer transistor T2. A contact C13 provided on the active region AA14 between the gate electrodes G13 and G14 is electrically connected to the contact C14 on the active region AA13 via an upper wiring layer.

The contact C12 connects the active region AA12 and the gate electrode G13. The contact C14 connects the active region AA13 and the gate electrode G11.

In the case of the point-symmetrical memory cell, the two adjacent memory cells MC in the direction in which the gate electrodes extend share one p-well 2. For this reason, the well 2 which composes a part of a certain memory cell MC is electrically connected to the well 2 which composes a part of the other memory cell MC which is adjacent to the former one in the direction in which the gate electrodes extend. In the direction in which the active regions extend, however, the conductive type wells 1 and 2 do not come in contact with each other. Consequently, an influence due to a soft error occurred in a certain memory cell MC can be contained within the adjacent memory cell MC in the direction in which the gate electrodes extend. That is, the area of the influence due to the soft error is narrower than the case of Jpn. Pat. Appln. KOKAI Publication No. 2003-100904.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device, comprising:
a semiconductor substrate having a first surface;
first wells of first conductive type formed on the semiconductor substrate;
second wells of second conductive type formed on the semiconductor substrate, the first wells surrounding each of the second wells on the first surface, the second wells surrounding each of the first wells on the first surface, one of the first wells and one of the second wells which are adjacent to each other composing a well pair; and an inverter pair composed of a first inverter and a second inverter, an input and an output of the first inverter being electrically connected to an output and an input of the second inverter respectively, transistors composing the inverter pair being formed in the well pair, wherein the first wells and the second wells are quadrate on the first surface, all sides of each of the first wells are shared by sides of the second wells, and all sides of each of the second wells are shared by the sides of the first wells.

2. The device according to claim 1, wherein
the first inverter includes a first transistor of the second conductive type formed in the first well, and a second transistor of the first conductive type formed in the second well, and the second inverter includes a third transistor of the second conductive type formed in the first well, and a fourth transistor of the first conductive type formed in the second well.

3. The device according to claim 2, wherein, in the well pair, only the first transistor, the second transistor, the third transistor and the fourth transistor are formed as transistors.

4. The device according to claim 2, further comprising:
a fifth transistor of the first conductive type whose one end is electrically connected to an output of the first inverter and which is formed in the second well in the well pair formed with the inverter pair; and a sixth transistor of the first conductive type whose one end is electrically connected to an output of the second inverter and which is formed in the second well in the well pair formed with the inverter pair.

5. The device according to claim 4, wherein, in the well pair, only the first transistor, the second transistor, the third transistor, the fourth transistor, the fifth transistor and the sixth transistor are formed as transistors.

6. A semiconductor integrated circuit devices comprising:
a semiconductor substrate having a first surface;
first wells of first conductive type formed on the semiconductor substrate;
second wells of second conductive type formed on the semiconductor substrate, the first wells surrounding each of the second wells on the first surface, the second wells surrounding each of the first wells on the first surface, two of the second wells and one of the first wells which is adjacent to and sandwiched by the two second wells composing a well group; and a storage circuit including a first inverter, a second inverter, a first transistor of the first conductive type and a second transistor of the first conductive type, an input and an output of the first inverter being electrically connected to an output and an input of the second inverter respectively, one end of the first transistor being electrically connected to the output of the first inverter, one end of the second transistor being electrically connected to the output of the second inverter, transistors composing the first inverter and the second inverter and the first transistor and the second transistor being formed on the well group, wherein the first wells and the second wells are quadrate on the first surface, all sides of each of the first wells are shared by sides of the second wells, and all sides of each of the second wells are shared by the sides of the first wells.

7. The device according to claim 6, wherein
the first inverter includes a third transistor of the second conductive type formed in the first well and a fourth transistor of the first conductive type formed in the second well, and the second inverter includes a fifth transistor of the second conductive type formed in the first well and a sixth transistor of the first conductive type formed in the second well.

* * * * *